(12) United States Patent
Izuhara et al.

(10) Patent No.: US 7,312,092 B2
(45) Date of Patent: Dec. 25, 2007

(54) METHODS FOR FABRICATION OF LOCALIZED MEMBRANES ON SINGLE CRYSTAL SUBSTRATE SURFACES

(75) Inventors: Tomoyuki Izuhara, Arlington, MA (US); Richard M. Osgood, Jr., Chappaqua, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 51 days.

(21) Appl. No.: 11/454,012

(22) Filed: Jun. 15, 2006

(65) Prior Publication Data
US 2007/0042516 A1 Feb. 22, 2007

Related U.S. Application Data

(63) Continuation of application No. PCT/US03/40392, filed on Dec. 17, 2003.

(51) Int. Cl.
*H01L 21/00* (2006.01)
(52) U.S. Cl. .................. 438/21; 438/407; 438/423; 438/514; 257/E21.563
(58) Field of Classification Search .............. None
See application file for complete search history.

(56) References Cited

U.S. PATENT DOCUMENTS

| | | | |
|---|---|---|---|
| 6,120,592 A | 9/2000 | Brault et al. | |
| 6,503,321 B2 | 1/2003 | Levy et al. | |
| 6,540,827 B1 | 4/2003 | Levy et al. | |
| 6,641,662 B2 | 11/2003 | Radojevic et al. | |
| 2004/0180519 A1* | 9/2004 | Schwarzenbach et al. | .. 438/514 |

* cited by examiner

*Primary Examiner*—Michael Lebentritt
*Assistant Examiner*—Kyoung Lee
(74) *Attorney, Agent, or Firm*—Baker Botts L.L.P.

(57) ABSTRACT

A method is provided for fabricating thin membrane structures in localized surface regions of a single crystal substrate. In the method, ion implantation masks are patterned on the surface of the single crystal substrate with openings that define the localized surface regions. Foreign ions are implanted through the openings into the single crystal substrate to modify the chemical and/or structural properties of subsurface layers at predetermined depths underneath super layers of material. These subsurface layers are removed by selective etching. The removal of the subsurface layers leaves the super layers of material intact as membrane structures on top of openings or channels corresponding to the space of the removed subsurface layers. At least one portion or end of a membrane structure remains attached to the single crystal substrate.

19 Claims, 8 Drawing Sheets

METHODS FOR FABRICATION OF LOCALIZED MEMBRANES ON SINGLE CRYSTAL SUBSTRATE SURFACES

CROSS-REFERENCE TO RELATED APPLICATIONS

This application is a continuation of International Application Serial No. PCT/US03/040392, filed Dec. 17, 2003, published Jul. 28, 2005, which is incorporated by reference in its entirety herein, and from which priority is claimed.

FIELD OF THE INVENTION

This invention relates to techniques for preparing starting materials for the fabrication of solid state devices. In particular the invention relates to ion slicing techniques for separating thin films of material from single crystal bulk material, and more particularly to the advancement of such techniques for the preparation of membrane structures in surface regions of a single crystal substrate.

BACKGROUND OF THE INVENTION

Thin films of crystalline material are desirable for a variety of solid state device applications. The solid state devices may exploit the electronic, optical, or other properties of the thin film materials. For example, optical wave retarder plates may be fabricated from ultra-thin films of single-crystal metal oxides exploiting the birefringence properties of the metal oxides. (See e.g., co-assigned Radojevic et al. U.S. Pat. No. 6,641,662 ("the '662 patent"), which is hereby incorporated by reference herein in its entirety). The desired thin films may have microscopic or mesoscopic thickness dimensions according to their intended use. The thin films may be free standing or supported on a substrate. In some material systems (e.g., in some III-V compound semiconductor systems) where the crystallographic properties of the desired thin films and the substrate material are compatible, the thin films can be formed by atomic layer-by-layer growth (i.e. epitaxial growth) on the substrates. In other material systems, the incompatibility of the crystallographic properties of the desired thin films and the substrate materials precludes epitaxial growth of the thin films. In such cases or, for example, in the case of epitaxially grown films where mesoscopic thickness are required, the desired thin films may be formed by detaching a surface layer of crystalline material from a bulk crystalline substrate material.

Figure 1:
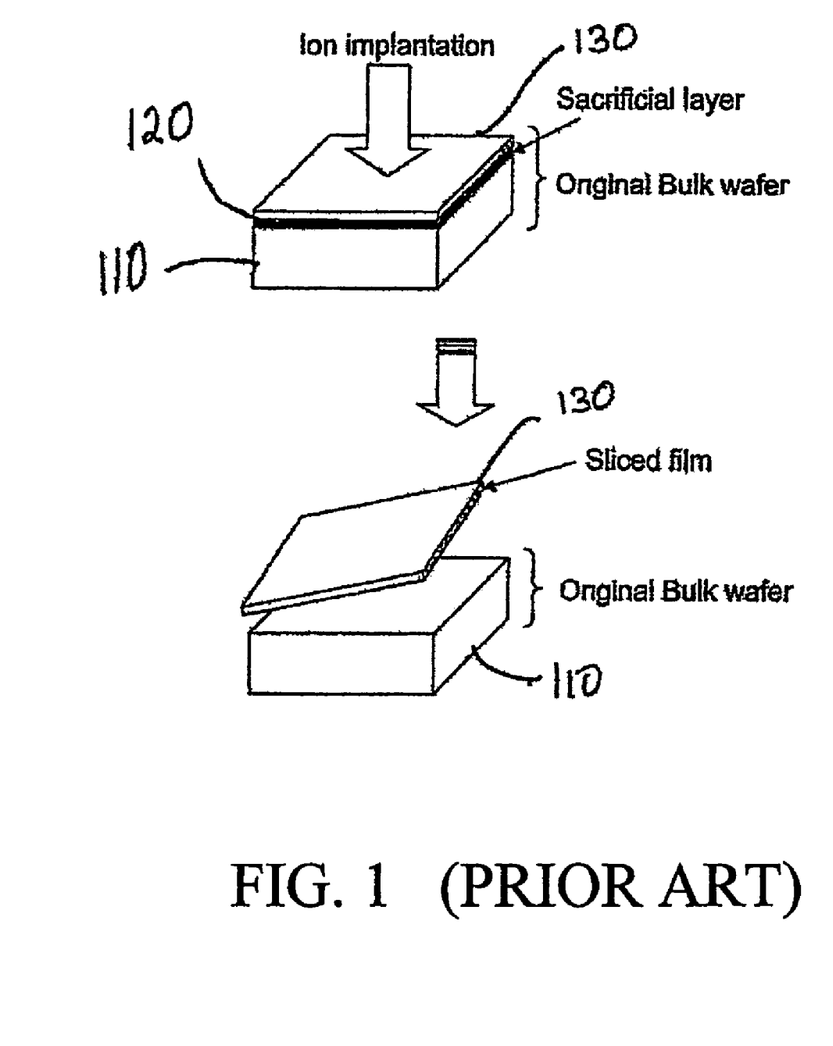
FIG. 1 schematically represents the ion implantation and chemical etching processes used in conventional ion slicing methods employed for detaching thin films from substrate materials.

Co-assigned U.S. Pat. No. 6,120,592, U.S. Pat. No. 6,503,321 and U.S. Pat. No. 6,540,827, all of which are incorporated by reference herein in their entireties, describe methods using ion implantation and selective etching processes for detaching a thin film of high crystalline quality from bulk single crystal material (e.g., lithium niobate crystals). For convenience the methods disclosed in these patents are referred to herein as "conventional ion-slicing methods" or "CIS methods". FIG. 1 schematically shows the primary processes used in the CIS methods. First, conventional ion-implantation processes are used to embed foreign ions (e.g., helium or hydrogen ions) in to a subsurface layer 120 of a single crystal bulk material 110 (e.g., $LiNbO_3$). The embedded ions mechanically and/or chemically alter the structure of subsurface layer 120 making it susceptible to thermo-mechanical fracture or preferential chemical etching. Then, a super layer 130 of high crystalline quality material may be detached from the single crystal bulk by thermo-mechanically fracturing subsurface layer 120 or by chemically removing subsurface layer 120.

The detached thin films prepared by the CIS methods may be free standing. The thickness dimensions of the detached thin films (e.g., super-layer 130) and subsurface layer 120 are design parameters that can be controlled by choice of the type, energy and dose of the foreign ions that are implanted in the subsurface layer. The thickness of the detached thin films can be small—in the range a few microns to less than a micron. The small thickness makes the thin films fragile. Further, the freestanding thin films are prone to breakage while handling or processing in further device fabrication steps. A solution to avoid breakage of the fragile thin films may involve bonding super layer 130 to mechanical support substrates, prior to use. However, the bonding processes can be complex and are not always satisfactory. Additionally, further processing is required to define lateral portions of the bonded thin films that are actually used in a device structure.

Consideration is now being given to methods of forming thin film membrane structures having narrow lateral dimensions for direct use in device structures. Attention also is directed to electrical and optical device structures in which such membrane structures are advantageously used.

SUMMARY OF THE INVENTION

In accordance with the principles of the invention, methods are provided for making membrane structures on a single crystal substrate. The membrane structures can be configured for use in optical and/or electronic devices. The device material systems in which the membrane structures can be made include, for example, silicon, germanium, silicon carbide, lithium niobate, yttrium iron garnet, potassium tanatalate and lithium tanatalate, The membrane structures are formed in localized surface regions of the single crystal substrate. In the process for making the membrane structures at a first step, the structural and chemical properties of subsurface layers in the localized regions of the single crystal substrate are modified to allow selective removal of the subsurface layer. The subsurface layers are structurally modified by implanting foreign ions (e.g., hydrogen, helium or oxygen) into them. The type of ions, energy and dose may be similar to those used in CIS processes. The energy of the implanted ions may be in the range of about 50 keV to about 4 MeV. In the first step, prior to the implantation, patterned masks are used to define the localized surface regions of the single crystal. The patterned masks are made of material designed to block ion implantation in areas outside the localized surface regions. The masks may be made from, for example, photo resists, polymers, or metal. Conventional lithographic techniques including, for example, photo lithography and electron beam lithography may be used to pattern the masks.

In a second step after ion implantation, the material of the modified subsurface layers is removed using suitable etchants (e.g., hydrofluoric acid and phosphoric acid). The removal of the subsurface layers leaves super layers of material intact as membrane structures on top of openings or channels corresponding to the space of the removed material. At least one portion or end of a membrane structure remains attached to the single crystal substrate.

The membrane structure/channel configurations may be advantageously used to miniaturize optical devices (e.g., optical waveguides, wavelength converters, optical modulators and isolators).

BRIEF DESCRIPTION OF THE DRAWINGS

Further features of the invention, its nature, and various advantages will be more apparent from the following detailed description of the preferred embodiments and the accompanying drawings, wherein like reference characters represent like elements throughout, and in which:

FIG. 2b is a schematic representation of the processing steps illustrated in the flow diagram of FIG. 1a.

FIG. 5 illustrates the measured mode shape in a membrane wave-guide fabricated according to the principles of the present invention. FIG. 5 also shows for comparison the measured mode shape in a conventional titanium indiffused lithium niobate waveguide.

DESCRIPTION OF THE INVENTION

The present invention provides methods for fabricating a thin membrane structure in a localized surface region of a crystalline substrate material. The membrane structure may have a narrow lateral dimension. The membrane structure may be separated vertically from the substrate material surface, but is integrally attached to the substrate material in at least one lateral direction. The inventive methods exploit the principles of the CIS methods described, for example, in co-assigned U.S. Pat. No. 6,120,592, U.S. Pat. No. 6,503,321 and U.S. Pat. No. 6,540,827, incorporated by reference herein.

Figure 2A:
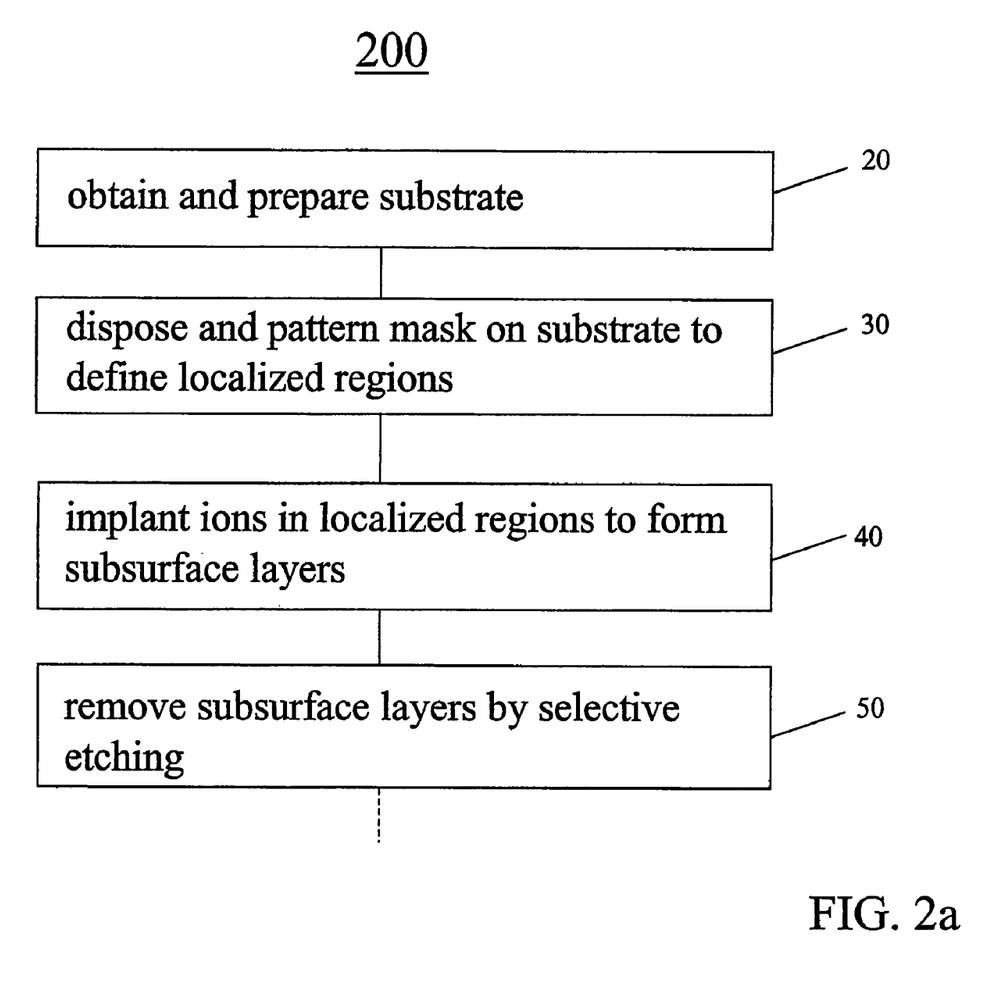
FIG. 2a is a flow diagram illustrating steps of an exemplary localized slicing process in accordance with the principles of the present invention.
Figure 2B:
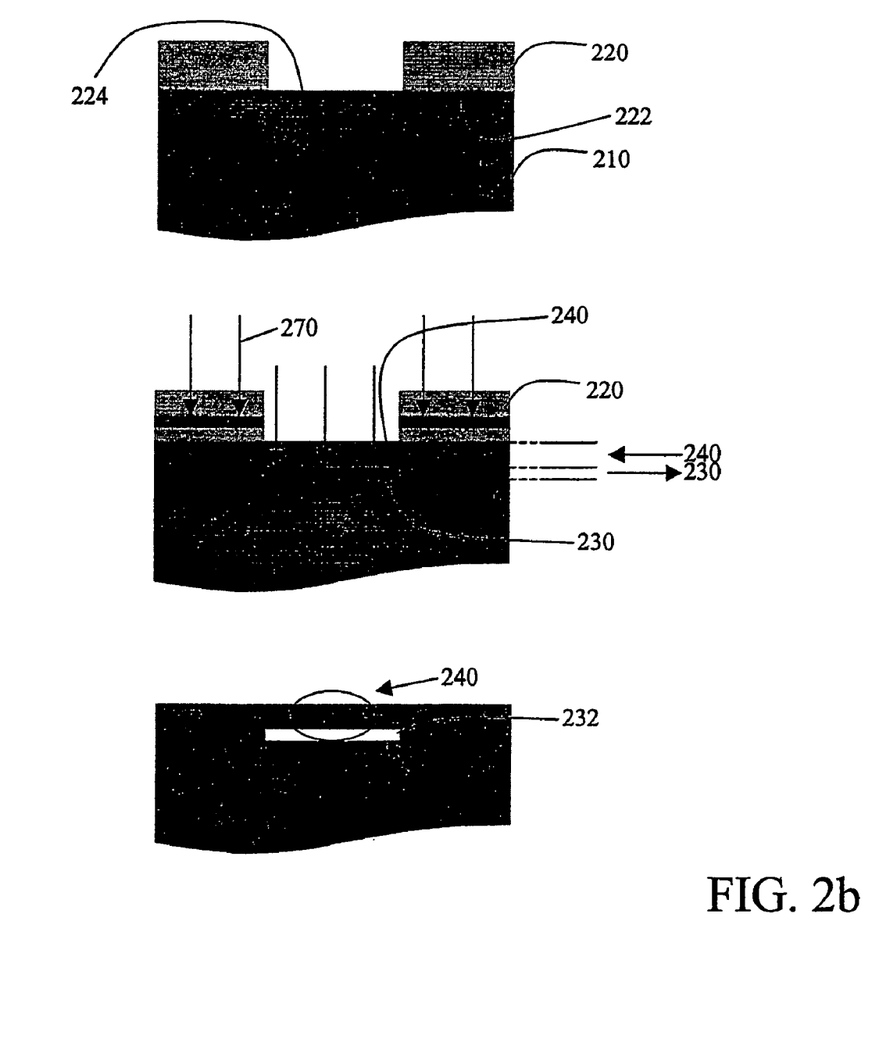

FIG. 2a is a flow chart showing exemplary steps of a localized ion slicing (LIS) method 200 that may be used to make localized membranes on a crystalline substrate material 210. FIG. 2b schematically represents the processing steps of FIG. 2a.

LIS method 200 may be utilized to advantageously provide membrane structures that can be readily incorporated in electronic devices, optical devices, sensors, and electromechanical devices (e.g., microelectronic mechanical systems (MEMS) devices) or other solid state devices. The devices may be based on common electronic material or photonic material systems. Electronic devices may, for example, be based on common Group IV elemental semiconductors such as silicon and germanium or compound semiconductors such as silicon carbide. Electrooptical or optical devices may, for example, be based on Group I and II metal oxides including iodates, niobates, titanates, tanatalates, and garnets.

LIS method 200 (like the CIS methods) uses foreign ions to modify the structural and chemical properties of subsurface regions of crystalline substrate materials. The ion implantation parameters (e.g., type of ions, energy and dose) may be selected in consideration of the type of substrate material 210. The ion implantation parameters selected in the LIS method 200 may be similar to those found useful in CIS methods. Exemplary ion implantation parameters that have been found to be useful in the CIS methods for various materials are shown in Table 1.

TABLE 1

| Material | Ion | Energy | Dose (ions/cm$^2$) | Implant depth |
| --- | --- | --- | --- | --- |
| LiNbO$_3$ | He | 3.8 MeV | 5 × 10$^{16}$ | 10 μm |
| YIG | He | 3.8 MeV | 5 × 10$^{16}$ | 10 μm |
| BaTiO$_3$ | H | 3.8 MeV | 1 × 10$^{17}$ | 10 μm |
| SrTiO$_3$ | H | 130 keV | 4.5 × 10$^{16}$ | 0.5 μm |
| KTaO3 | He | 3.8 MeV | 9 × 10$^{15}$ | 10 μm |
| LiTaO$_3$ | He | 3.0 MeV | 2.5 × 10$^{16}$ | |
| Si | H | 160 keV | 5 × 10$^{16}$ | |
| Ge | H | 160 keV | 5 × 10$^{16}$ | |
| SiC | H | 160 keV | 5 × 10$^{16}$ | |

With continued reference to FIGS. 2a and 2b, at a preliminary step 20 in LIS method 200, substrate material 210 is obtained in a suitable pre-processed form. Substrate material 210 may, for example, be a virgin wafer or a processed wafer on which other device structures or components have been pre-fabricated. At step 30, localized surface regions of the surface of substrate material 210 are delineated. The localized surface regions correspond to regions where the intended membrane structures will be formed. The localized surface regions may be delineated in lateral directions by disposing an ion implantation mask 220 on substrate material 210.

Figure 6A:
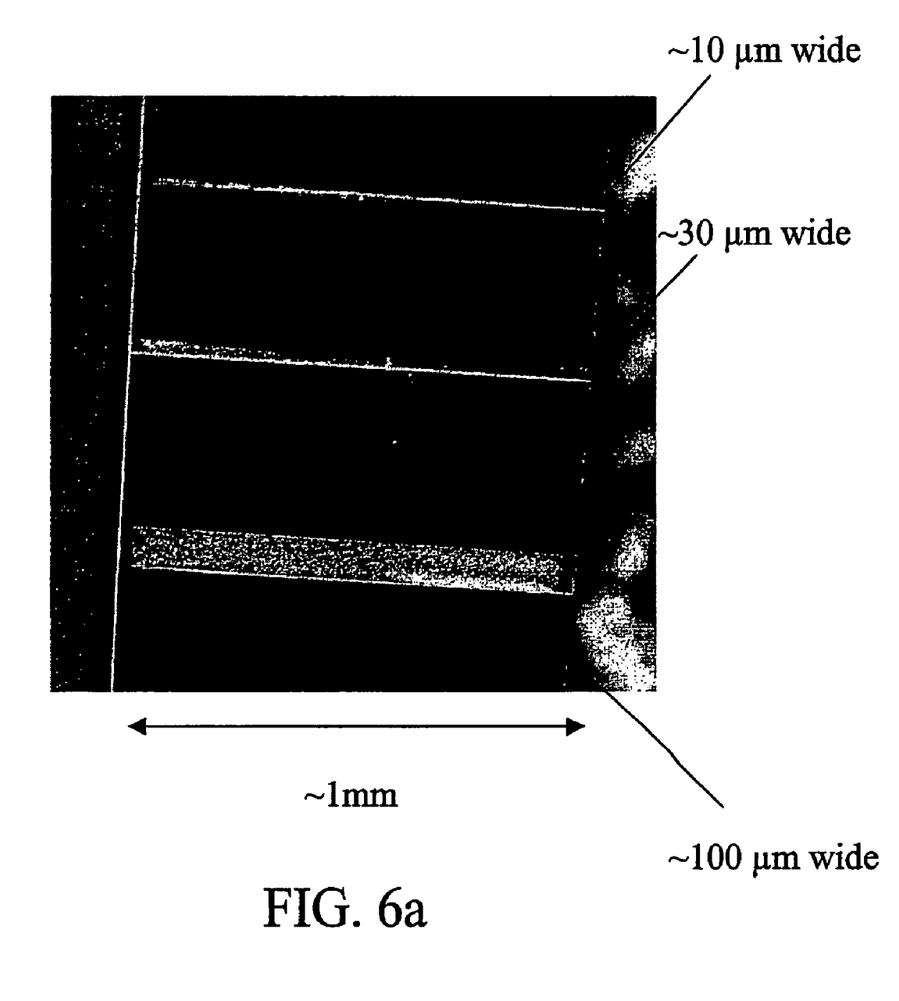
FIG. 6a is a micrograph of a lithium niobate wafer illustrating membrane structures of various widths that are fabricated in accordance with the present invention.
Figure 6B:
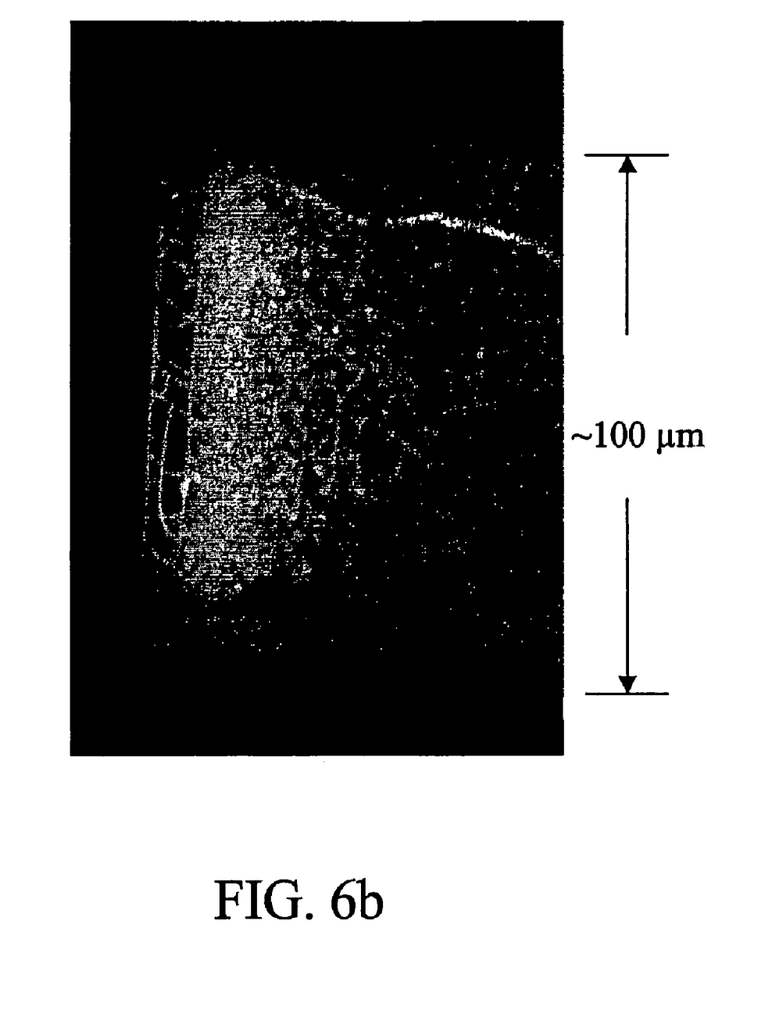
FIG. 6b is a micrograph showing an enlarged view of a 100 microns-wide membrane structure fabricated in accordance with the present invention.

Ion implantation mask 220 may be disposed on substrate material 210 using, for example, conventional photolithography techniques and materials. Mask 220 may form a pattern of masked areas 222 and unmasked areas 224 on the surface of substrate material 210. Unmasked areas 224 may correspond to the localized surface regions in which the intended membrane structures will be fabricated. Unmasked areas 224 may have shapes and dimensions that are selected with consideration to the desired dimensions and shapes of the intended membrane structures. For example, for an intended rectangular membrane structure of width W and length L, unmasked area 224 may have a corresponding rectangular shape. It will be understood that the dimensions and shapes of the fabricated membrane structures may be limited by the material properties (e.g., structural strength) of the substrate material. However, for most common substrate materials, useful membrane structures of that are several mm long and several tens of microns wide may be readily fabricated. FIG. 6 shows, for example, a micrograph of a lithium niobate wafer in which membrane structures having widths ranging from about 10 microns to about 100 microns have been fabricated.

The masked surface areas and the unmasked surface areas of substrate material 210 are exposed to a beam of foreign ions 270 at a subsequent process step 40. The materials and thickness of mask 220 may be suitably chosen to block implantation of ions 270 in to substrate material 210 through the masked areas 222. Suitable materials for mask 220 can be commonly available photo resists, polymers, metals films, and other ion-blocking or absorbing materials.

At ion implantation step 40, foreign ions 270 are implanted through unmasked surface areas 224 into a subsurface layer 230 of the substrate material 210. Subsurface layer 230 is at a depth D in substrate material 210 underneath a super layer 240. Ion implantation step 40 may be designed to suitably modify the structural and/or chemical properties of subsurface layer 230 to facilitate its selective removal later on. The ion type, energy, dose and other ion implantation parameters may be suitably designed according to the type of substrate material 210 and a targeted depth D of subsurface layer 230.

Depth D is a process parameter that is related to a designed thickness of an intended membrane structure. Physically, depth D is related to the energy-dependent range of the implanted ion species in the substrate material. The design criteria or process parameters for ion implantation step 40 may be similar to those in CIS methods. For example, when a lithium niobate membrane structure of thickness about 3 μm (10 μm) is desired, helium ions having energies of about 1.4 MeV (3.8 MeV) may be used to form subsurface layer 230 at a depth D of about 3.2 μm (10 μm) below a lithium niobate crystal surface. (Also see e.g., Table 1). The lateral dimensions of subsurface layer 230 generally correspond to the lateral dimensions of unmasked area 224. The thickness T of subsurface layer 230 may be defined to be that thickness over which the properties of subsurface layer 230 are substantially modified by the embedded ions. Physically, thickness T is function of the energy-dependent range and straggle of the implanted ions. In most instances where single energy ion implantation is conducted, T may be about the order of one tenth of a micron. Larger values of T, for example, up to about one micron, may be obtained by varying the ion implant energy and conducting suitable multiple energy ion implantations.

At optional step 45 (not shown), which may be carried out after step 40, an edge of subsurface layer 230 is physically exposed for access by wet or dry etchants. Physical access to subsurface layer 230 may be gained by forming a hole (e.g., etch pit) through a portion of substrate material 210 and/or super layer 240. Conventional dry or wet etching techniques may be used for this purpose. Step 45 may be avoided by making provisions for exposing an edge of subsurface layer 230 in the earlier stages of LIS method 200. For example, at step 20 substrate material 210 may be provided with topography (e.g., grooves or mesas) so that an edge of subsurface layer 230, which is formed at step 40, intersects an exposed topographic surface feature. Other optional steps (not shown) that are designed to facilitate later removal of subsurface layer 230 also may be carried out after step 40. These optional steps may, for example, include rapid thermal annealing which is designed to improve the selective etch characteristics of subsurface layer 230. (See e.g., FIG. 9 U.S. Pat. No. 6,540,827).

Next at step 50 in LIS method 200, subsurface layer 230 may be selectively removed through its exposed edge leaving a super layer 240, i.e. membrane 240, intact above the removed material. Conventional wet or dry etchants may be used to selectively remove subsurface layer 230. The removal of subsurface layer 230 material creates an air channel 232 underneath super layer/membrane 240. The thickness of the air channel may substantially correspond to the thickness T of the removed subsurface layer 230. Similarly, the thickness of membrane 240 may substantially correspond to the depth D of removed subsurface layer 230 (below the top surface of substrate 210).

EXAMPLE 1

In a demonstration of LIS method 200, membrane structures were fabricated on a single-crystal, Z-cut lithium niobate wafer. A commercially available epoxy based photo resist (photo resist No. SU-8 sold by MicroChem Corp. of 1254 Chestnut Street, Newton, Mass. 02464) was used as the ion implantation mask material (e.g., mask 220).

To fabricate the demonstrative membrane structures, a lithium niobate wafer (210) was spin coated with a SU-8 photoresist layer (220) having a thickness of about 100 μm. This photo resist layer was patterned in alternating stripes of masked areas and unmasked areas extending up to the edge of the wafer. Each the unmasked areas was about 1 mm wide and about 5 mm long. Helium ions were implanted into the wafer through the unmasked regions. The helium ion energy and dose were 3.8 MeV and $5 \times 10^{16}$ ions/cm$^2$, respectively. Subsequently, the wafer was etched in an hydrofluoric acid solution for up to about 20 hours. This etching resulted in removal of the sub surface region (230) formed by the helium ion implantation. A 10 μm-thin membrane layer 240 was left intact above the removed material.

Figure 3A:
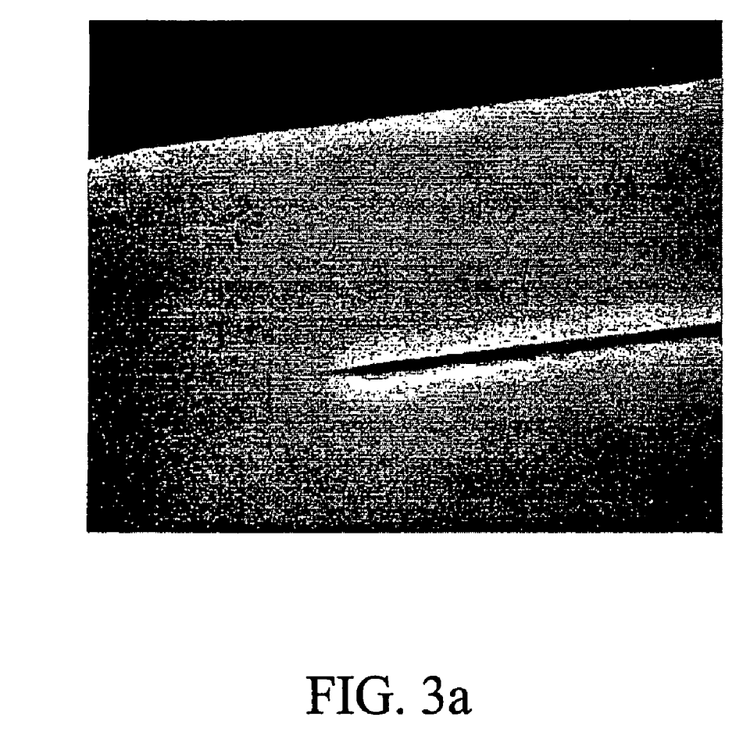
FIGS. 3a and 3b are scanning electron micrographs of a membrane structure formed on a lithium niobate substrate wafer using a localized ion slicing process in accordance with the principles of the present invention. The micrographs in FIGS. 3a and 3b respectively show a cross sectional view and a plan view of sections of the lithium niobate substrate wafer.
Figure 3B:
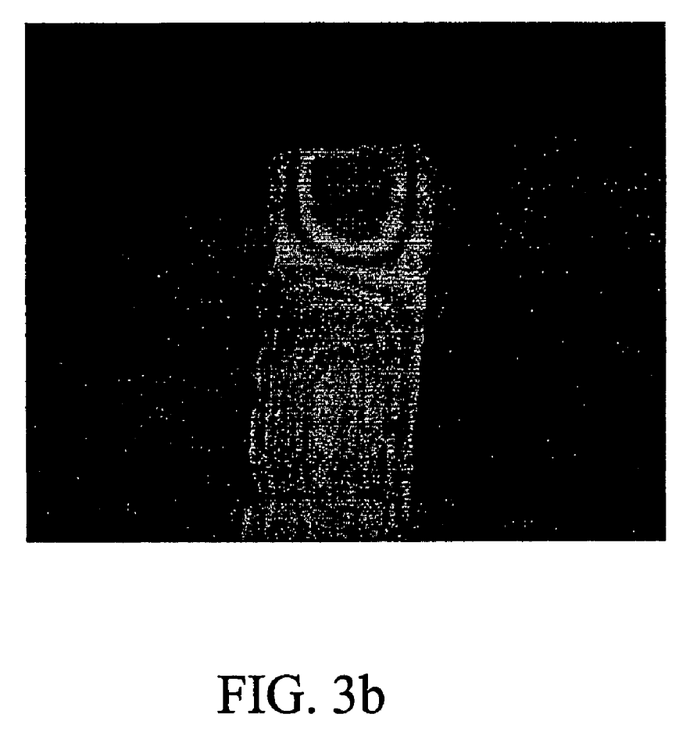

FIGS. 3a and 3b show micrographs of the processed wafer in plan and cross sectional views, respectively. An air channel 232 is seen separating membrane 240 vertically from substrate 210. The width of air channel 232 is about 1 mm. This width is substantially the same as the width of the unmasked areas 224 formed in masking photo resist layer 220. No substantial etching of wafer material underneath masked regions 222 was observed. The length of air channel 232 is about 5 mm.

It will be understood that the particular dimensions of the membrane structure 240 and air channel 232 shown in FIGS. 3a and 3b are exemplary and cited herein only for purposes of illustration. It will be understood that LIS method 200 may be used to fabricate membrane structure/air channel configurations having any suitable dimensions as needed for a particular device design or application. The operation of a device having the membrane/air channel configuration may advantageously utilize the material and geometrical properties of the combination of the membrane structure and air channel. For certain device applications, for example, in micro-fluidics or lab-on-chip biological analysis, the geometry of the air channel itself can be advantageously exploited, for example, as a fluid pathway.

In an exemplary device application, the membrane structure/air channel combination is configured as an optical waveguide ("membrane waveguide"). The use of the geometrical well-defined membrane structure/air channel configuration can be beneficial for the performance of an optical waveguide. The performance of a planar optical waveguide (e.g., mode size, propagation constant, curvature, and loss) is generally a function of the difference in the refractive indices of the optically heterogeneous guiding and thickness of the materials that are used to make the waveguide. In conventional optical waveguides (e.g., lithium niobate waveguides), diffusion processes are used to make the optically heterogeneous guiding materials (e.g., lithium niobate with titanium in-diffusion or proton exchange). The refractive index differences between the diffused and undiffused materials regions of the conventional optical waveguides change gradually and are small in absolute value. In contrast, the present membrane waveguides benefit from the large refractive index difference between air (channel) and solid material (membrane). Further, the membrane structures/air channel configuration provides beneficially abrupt interfaces between the two guiding refractive media in the membrane waveguides. The fabrication of membrane waveguides may be integrated with the fabrication of conventional device components (e.g., isolators, lasers or detectors) for advantageous realization of an optical "sub system" on a single substrate.

EXAMPLE 2

In this demonstrative example, membrane wave-guides utilizing the membrane structure/air channel configuration were fabricated on a lithium niobate wafer using LIS method 200 (FIG. 2*a*). For comparison, conventional titanium in-diffused waveguides were also fabricated on similar lithium niobate wafers. The conventional titanium in-diffused waveguides were fabricated using common techniques including, for example, resist patterning, metal sputtering, metal lift off, thermal diffusion and annealing. In the demonstrative example, 3-μm wide titanium diffused stripes were made in the lithium niobium wafer. These titanium diffused stripes formed the optical channels of the conventional waveguides.

Titanium enrichment of lithium niobate is commonly believed to lend temperature stability to the optical properties of lithium niobate in addition to modifying its the refractive index. Accordingly, by choice the membrane structures of the membrane waveguides may be preferably fabricated in the titanium in diffused regions of the lithium niobate wafer. In this comparative example, however, 10 μm-100 μm wide membrane structures having thickness of about 3 μm and 10 μm were fabricated in usual lithium niobate material without titanium in-diffusion. The membrane structures were fabricated using method steps that were similar to those described with reference to FIG. 2*a* and Example 1 above. Therefore, for brevity the description of the steps in this example is limited.

At step 30 of LIS method 200, an SU-8 polymer resist mask was disposed on lithium niobate wafers to define localized surface areas designated for the formation of the membrane structures. The resist layers were patterned to expose localized surface regions that were about 3 μm wide. At step 40, helium ions were implanted in the lithium niobate wafers. Two different implant energies of either 1400 keV or 3800 keV were used (corresponding to implant depths of 3 μm and 10 μm, respectively). The implant dose corresponding to an ion concentration at the peak value of about 21500 (atoms/cm3)/(ions/cm2) was used. The implant dose was estimated to endow the implanted subsurface regions with high selective etch properties.

At step 45, the implanted wafers were subject to rapid thermal annealing to improve etch rate characteristics of the subsurface regions. In order to avoid thermo-mechanical fracture or slicing of the implanted subsurface region, the rapid thermal annealing rates were suitably adjusted in proportion to the implantation depth. Heating rates of 300° C./20 sec and 400° C./20 sec, were chosen for wafers implanted with 1.4 MeV and 3.8 MeV helium ions, respectively. After the rapid annealing treatment, at step 150 the subsurface regions were removed by etching in a solution of dilute hydrofluoric acid. After conventional cleaning and drying operations, the wafers were inspected under a microscope. The membrane structures formed 2-dimensional planar waveguides.

Figure 4A:
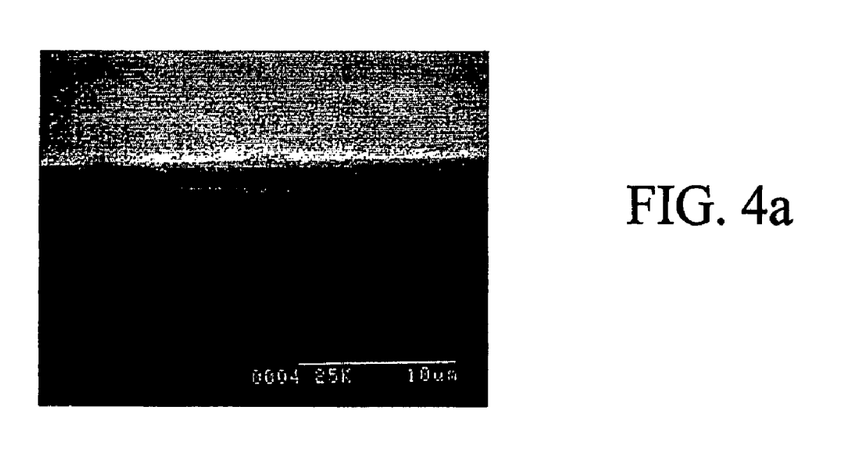
FIGS. 4a and 4b are micrographs of a lithium niobate wafer having a membrane structure fabricated for use as a waveguide, in accordance with the present invention.
Figure 4B:
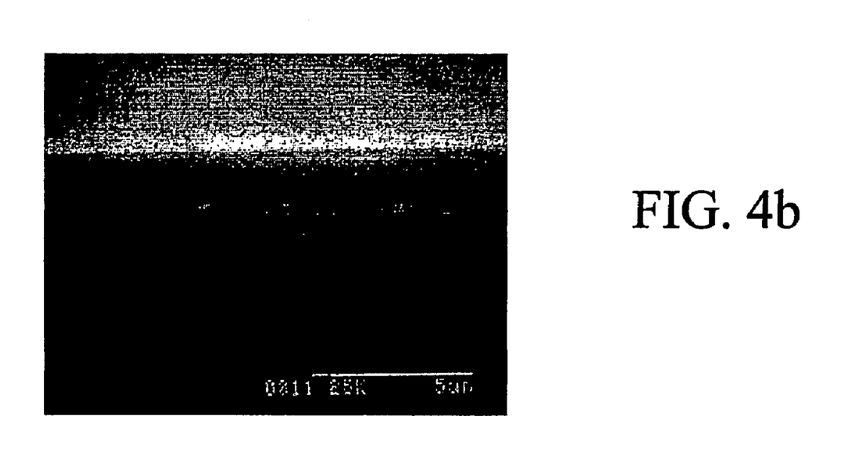
Figure 5:
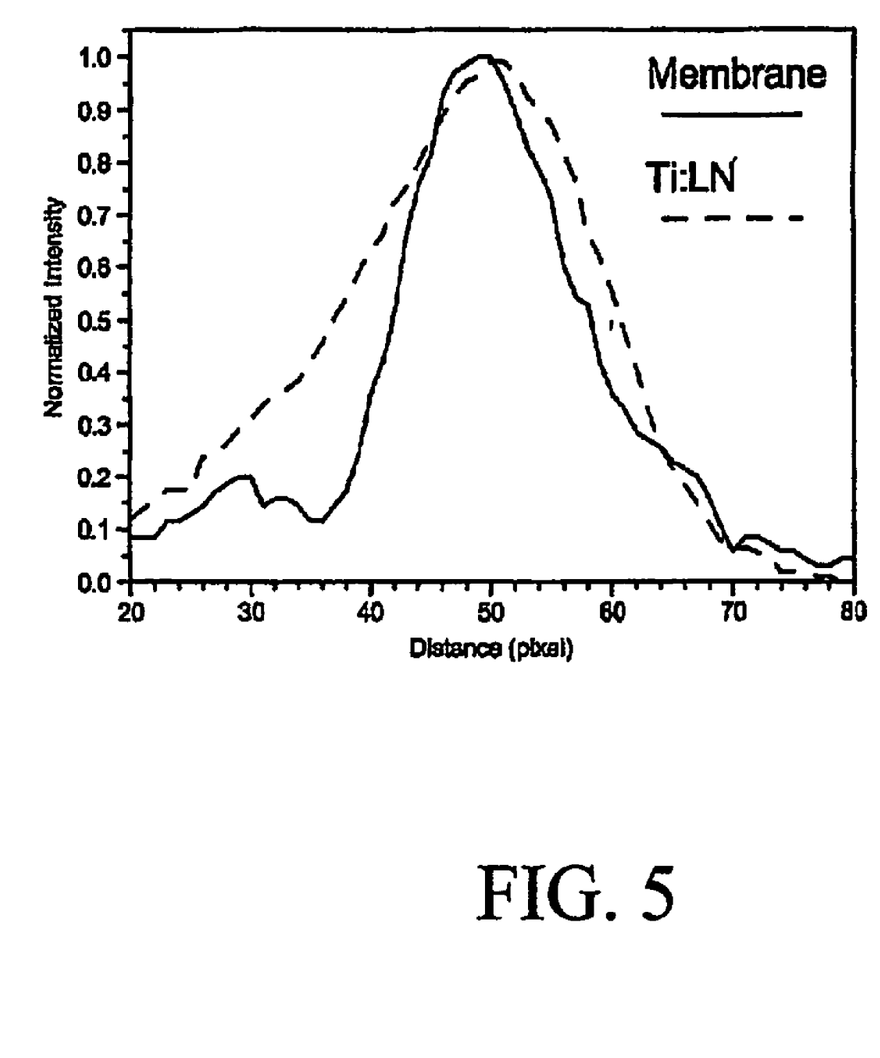

FIGS. 4*a* and 4*b* show micrographs of exemplary processed wafers implanted with 1.4 MeV helium ions. Membrane wave-guide structures that are about 3 μm thick are visible. The mode shapes in a membrane waveguide and conventional titanium in diffused waveguide were imaged using a CCD camera. FIG. 5 shows the mode shape measured across the width of the 2-dimensional planar waveguide formed by the membrane structure of FIG. 4. FIG. 5 also shows for comparison he measured mode shape in the conventional titanium indiffused waveguide. The mode shape in the membrane waveguide is seen to be narrower than the mode shape of the conventional titanium in diffused waveguide.

It will be understood that the foregoing is only illustrative of the principles of the invention and that various modifications can be made by those skilled in the art without departing from the scope and spirit of the invention, which is limited only by the claims that follow.

The invention claim is:

1. A method for fabricating a membrane structure in a localized surface region of a substrate, comprising:
   disposing a mask on a top surface of the substrate;
   patterning the mask to define a masked area and an unmasked area, wherein the unmasked area corresponds to the localized surface region;
   implanting foreign ions into the substrate through the unmasked area to modify a subsurface layer in the localized surface region, wherein the subsurface layer is at a selected depth below the top surface of the substrate; and
   removing the material of the modified subsurface layer, whereby a channel is formed in the localized surface region of the substrate and a super layer of material is left substantially intact between the top surface and the channel.

2. The method of claim 1, wherein the foreign ions are either hydrogen ions or helium ions.

3. The method of claim 1, wherein a selection of an ion implantation energy selects the depth of the subsurface layer.

4. The method of claim 1 wherein foreign ions with multiple energies are implanted to obtain a modified subsurface layer having a thickness greater than about one tenth of a micron.

5. The method of claim 4, wherein a thickness of the channel obtained after removal of the subsurface layer is greater than about one tenth of a micron.

6. The method of claim 1 wherein a thickness of the channel obtained after removal of the subsurface layer is about one tenth of a micron.

7. The method of claim 1, wherein removing the material of the modified subsurface layer further comprises exposing an edge of the subsurface layer for physical access by etchants.

8. The method of claim 7 wherein exposing an edge of the subsurface layer comprises forming a hole in the superlayer of material.

9. The method of claim 7 wherein physically exposing an edge of the subsurface layer comprises providing the substrate with topography having an exposed topographic feature and forming the subsurface layer so that it intersects the exposed topographic feature.

10. The method of claim 7, wherein removing the material of the modified subsurface layer further comprises using etchants to selectively etch the material of the subsurface layer.

11. The method of claim 1, wherein removing the material of the modified subsurface layer further comprises first annealing the substrate to improve a selective etch characteristic of the subsurface layer.

12. The method of claim 1 wherein a width of the channel is greater than 1 mm and a length of the channel is substantially greater than 1 mm.

13. The method of claim 1 wherein a thickness of the super layer is between about 1 micron and about 10 microns.

14. The method of claim 1 wherein a thickness of the super layer is less than about 1 micron.

15. A device comprising a membrane structure fabricated by the method of claim 1.

16. A waveguide comprising a membrane structure fabricated by the method of claim 1, wherein the interface between the super layer material and the channel acts as a wave guiding surface.

17. The waveguide according to claim 16 wherein the super layer comprises titanium in diffused material.

18. The waveguide according to claim 17 wherein the substrate comprises lithium niobate.

19. The method of claim 1, wherein the substrate is one of $LiNbO_3$, $LiTaO_3$, $LiIO_3$, $\beta$-$BaB_2O_4$ and $LiB_3O_5$.

* * * * *